(12) United States Patent
Itkonen et al.

(10) Patent No.: US 7,872,885 B2
(45) Date of Patent: Jan. 18, 2011

(54) POWER LEVEL BALANCE OF FREQUENCY CONVERTERS CONNECTED IN PARALLEL

(75) Inventors: Toni Itkonen, Lappeenranta (FI); Mika Ikonen, Lappeenranta (FI); Kimmo Rauma, Vaasa (FI); Stefan Strandberg, Vörå (FI); Jorma Vesti, Vaasa (FI)

(73) Assignee: Vacon OYJ, Vasa (FI)

( * ) Notice: Subject to any disclaimer, the term of this patent is extended or adjusted under 35 U.S.C. 154(b) by 656 days.

(21) Appl. No.: 11/892,110

(22) Filed: Aug. 20, 2007

(65) Prior Publication Data

US 2008/0049462 A1 Feb. 28, 2008

(30) Foreign Application Priority Data

Aug. 25, 2006 (FI) .................................. 20060759

(51) Int. Cl.
*H02M 7/00* (2006.01)

(52) U.S. Cl. ....................................................... 363/65

(58) Field of Classification Search .................. 363/65, 363/67, 69, 71
See application file for complete search history.

(56) References Cited

U.S. PATENT DOCUMENTS

| | | | | |
|---|---|---|---|---|
| 4,553,197 A | * | 11/1985 | Stemmler ..................... | 363/37 |
| 4,849,870 A | * | 7/1989 | Heinrich ...................... | 363/37 |
| 5,272,612 A | * | 12/1993 | Harada et al. ................. | 363/8 |
| 5,450,309 A | | 9/1995 | Rohner et al. | |
| 5,546,298 A | | 8/1996 | Rohner | |
| 5,757,634 A | | 5/1998 | Ferens et al. | |
| 5,923,550 A | * | 7/1999 | Kumar ........................ | 363/69 |
| 7,327,588 B2 | * | 2/2008 | Ollila ......................... | 363/71 |
| 7,633,783 B2 | * | 12/2009 | Manabe et al. .............. | 363/149 |
| 2005/0047182 A1 | | 3/2005 | Kraus et al. | |
| 2009/0003020 A1 | * | 1/2009 | Zhang et al. ................. | 363/65 |

FOREIGN PATENT DOCUMENTS

| | | |
|---|---|---|
| DE | 4038869 C1 | 8/1991 |
| DE | 4341868 A1 | 6/1994 |
| EP | 0524398 A2 | 5/1992 |
| EP | 600312 A2 | 6/1994 |
| EP | 1427094 A2 | 6/2004 |

\* cited by examiner

*Primary Examiner*—Adolf Berhane
(74) *Attorney, Agent, or Firm*—Birch, Stewart, Kolasch & Birch, LLP

(57) ABSTRACT

A method and a parallel connection arrangement for equalizing the output powers of power converter units (INU11, INU12), in which power converter units is a semiconductor switch bridge controlled with pulse width modulation, and in which is a control unit arrangement (CU1, CU2) for forming control pulses, with which the semiconductor switches are controlled. The control unit arrangement delays the falling edge of the control pulses of at least one semiconductor switch of at least one power converter unit.

2 Claims, 4 Drawing Sheets

POWER LEVEL BALANCE OF FREQUENCY CONVERTERS CONNECTED IN PARALLEL

FIELD OF TECHNOLOGY

The present invention relates to a method for balancing the output powers of frequency converters connected in parallel. The invention also relates to a parallel connection arrangement of power converter units connected in parallel.

Parallel connection of frequency converters is required in the control of motors of very high output power (e.g. >1 MW), because owing to the power components available the power handling ability of individual frequency converters is substantially smaller.

PRIOR ART

Figure 1:
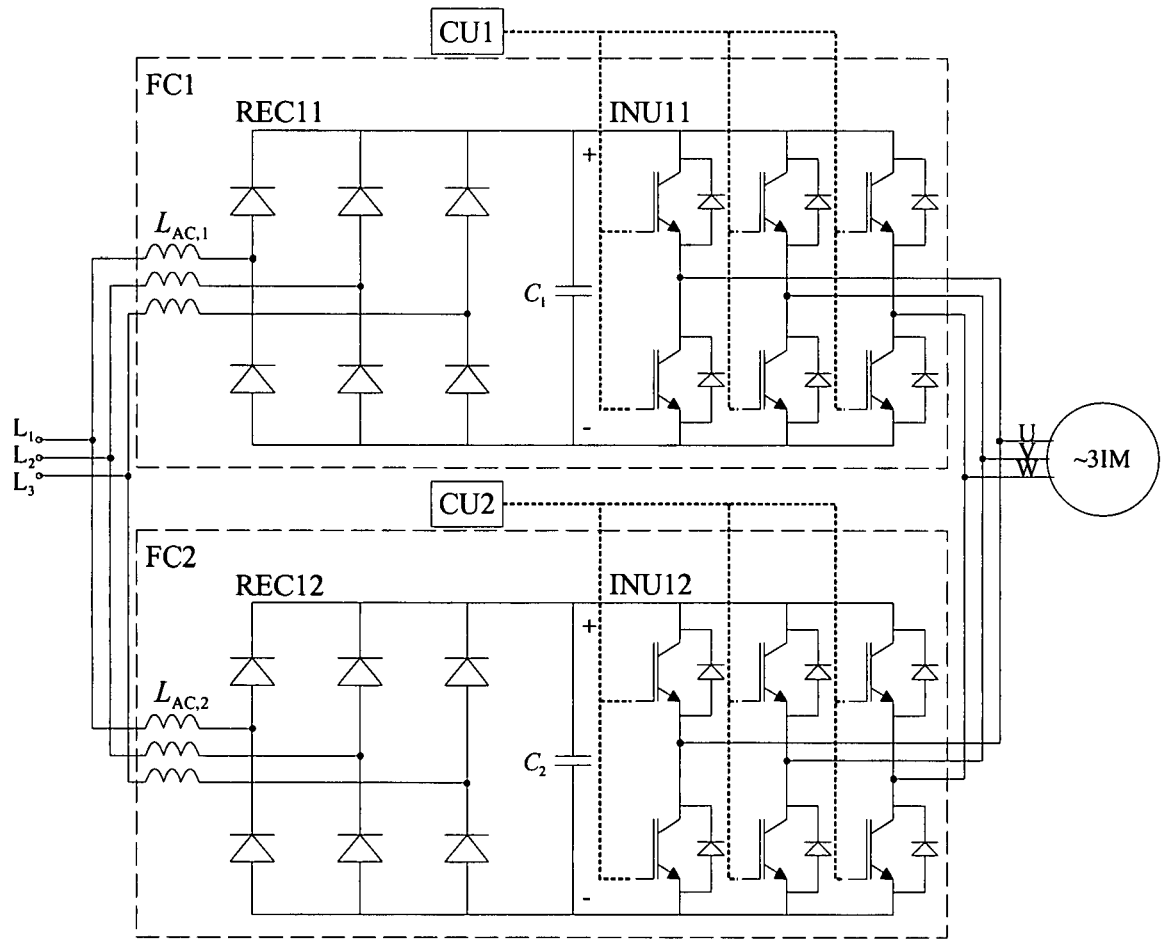

The distribution of power between appliances connected in parallel is not generally uniform, even if the switching instructions are simultaneous. Uneven distribution causes, among other things, non-idealities of power modules and non-simultaneities of control pulses caused by the control circuits. FIG. 1 presents a parallel connection formed from two frequency converters. In the parallel connection presented in the figure, the non-simultaneities of the control pulses cause current peaks between the appliances; in the worst case, a short-circuit between the appliances. The non-simultaneity of the control pulses corresponds in principle to disparities occurring in the firing delays and extinguishing delays of the power modules.

Two cases of non-simultaneities of the control pulses must be distinguished; rising-edge non-simultaneity (commutation from the diodes to the IGBT) and falling-edge non-simultaneity (commutation from the IGBT to the diodes). In rising-edge non-simultaneity the IGBTs of the parallel appliances are fired at different times. The IGBT fired first takes the greatest part of the load current. When the switching time difference is sufficient, the current peak can grow to be greater than the load current. In falling-edge non-simultaneity the IGBTs are extinguished at different times. Now the IGBT extinguished last takes the greatest part of the load current. The current peak produced can in this case grow to the same magnitude as the load current.

SUMMARY OF THE INVENTION

The firing controls of the power switches according to this invention are simultaneous and the power balance regulation is implemented simply by changing the timing of the falling edge of the control pulse such that the falling edge of the control pulse of the IGBT conducting the current is delayed.

The characteristic features of the solution according to the invention are described in detail in the claims below.

SHORT DESCRIPTION OF THE DRAWINGS

In the following, the invention will be described in more detail by the aid of an embodiment with reference to the attached drawings, wherein FIG. 1 presents two frequency converters connected in parallel, which supply an alternating-current electric motor.

Figure 2:
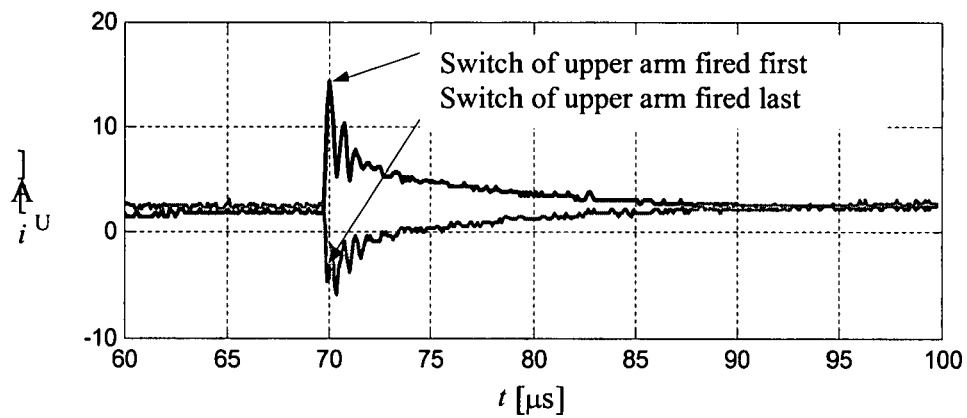

FIG. 2 presents the output currents of frequency converters connected in parallel, in the case where the rising edges of the control pulses are not simultaneous.

Figure 3:
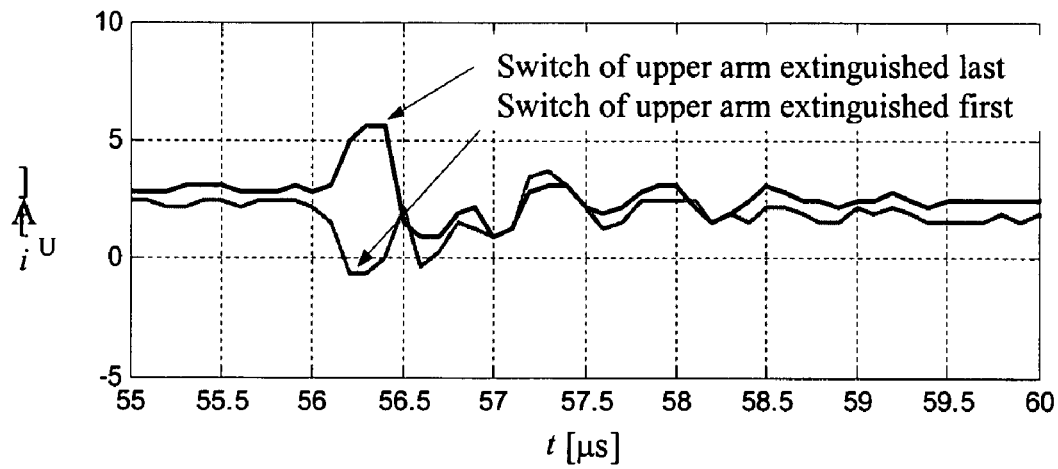

FIG. 3 presents the output currents of frequency converters connected in parallel, in the case where the falling edges of the control pulses are not simultaneous.

Figure 4:
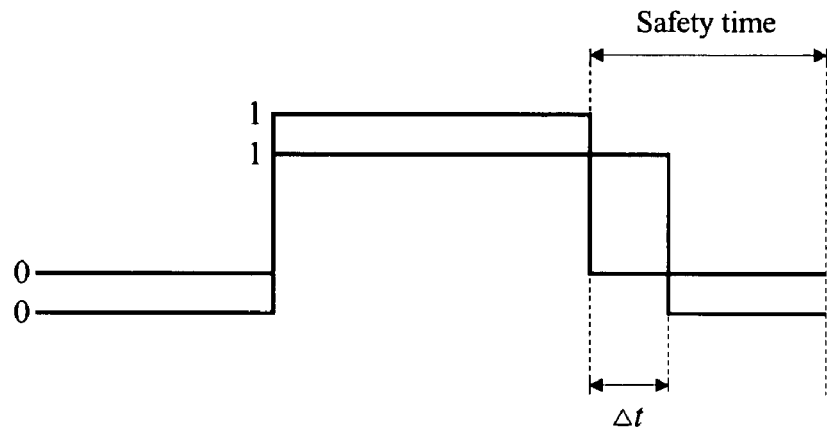

FIG. 4 presents the control pulses of two IGBTs connected in parallel, of which the falling edge of one is delayed by Δt at the expense of the safety time.

Figure 4A:
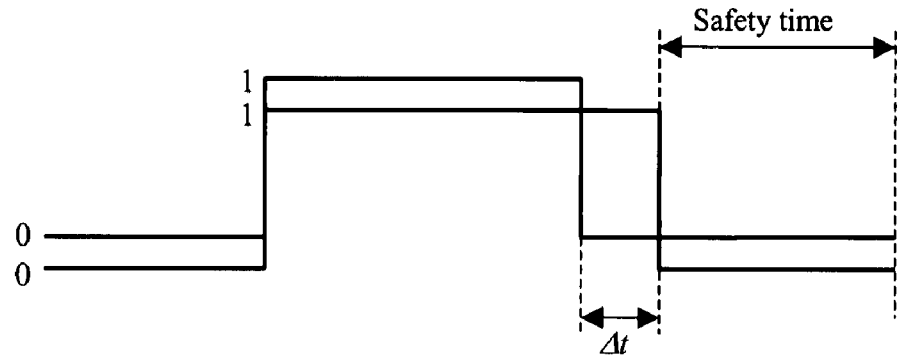

FIG. 4a presents the control pulses of two IGBTs connected in parallel, of which the falling edge of one is delayed by Δt without shortening the safety time.

Figure 5:
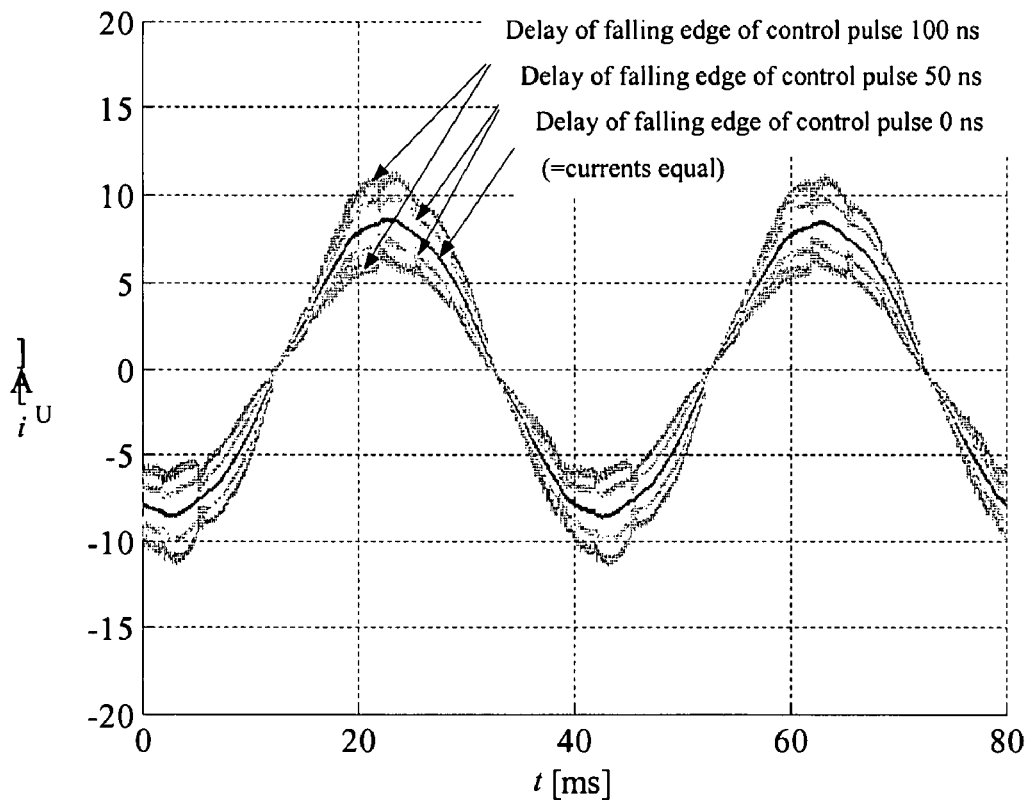

FIG. 5 presents the simulated output currents of frequency converters connected in parallel when the delay of the falling edge of the control pulse is varied between Δt=0 . . . 100 ns, the inductance between the output terminals and the common point $L_{out}$=100 µH and the switching frequency is 10 kHz.

Figure 6:
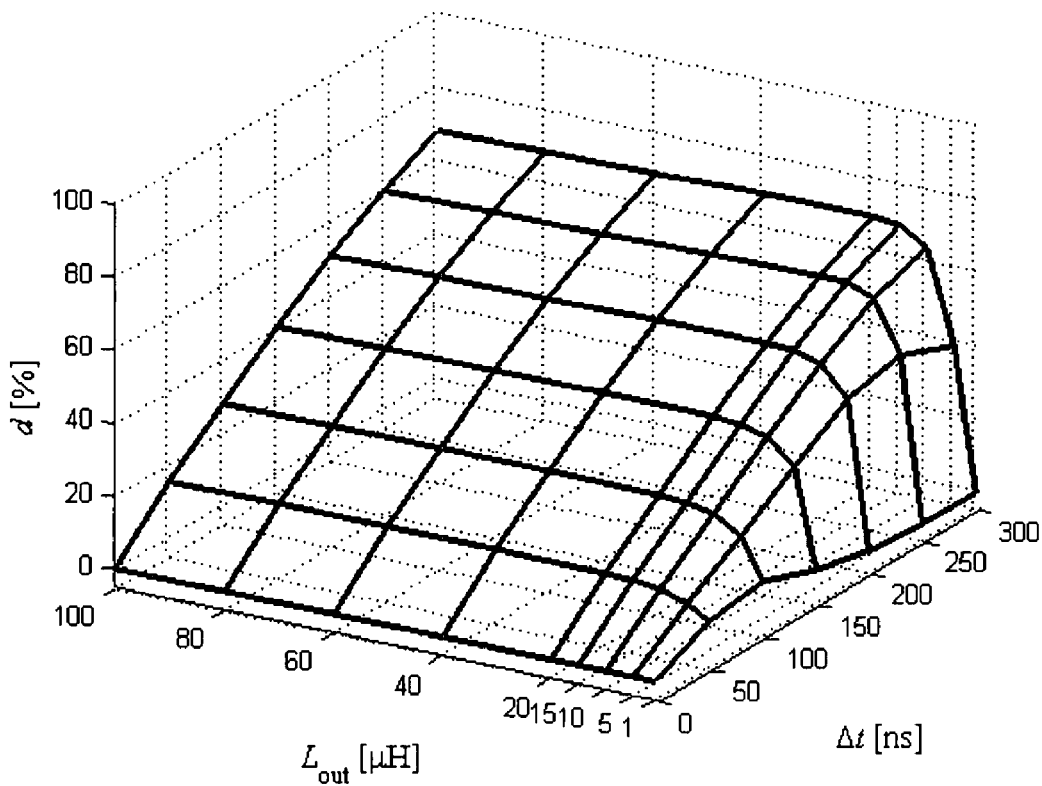

FIG. 6 presents the disbalance d of the effective values of frequency converters connected in parallel as a function of the inductance $L_{out}$ between the output terminals and the common point and of the delay Δt of the falling edge of the control pulse.

Figure 7:
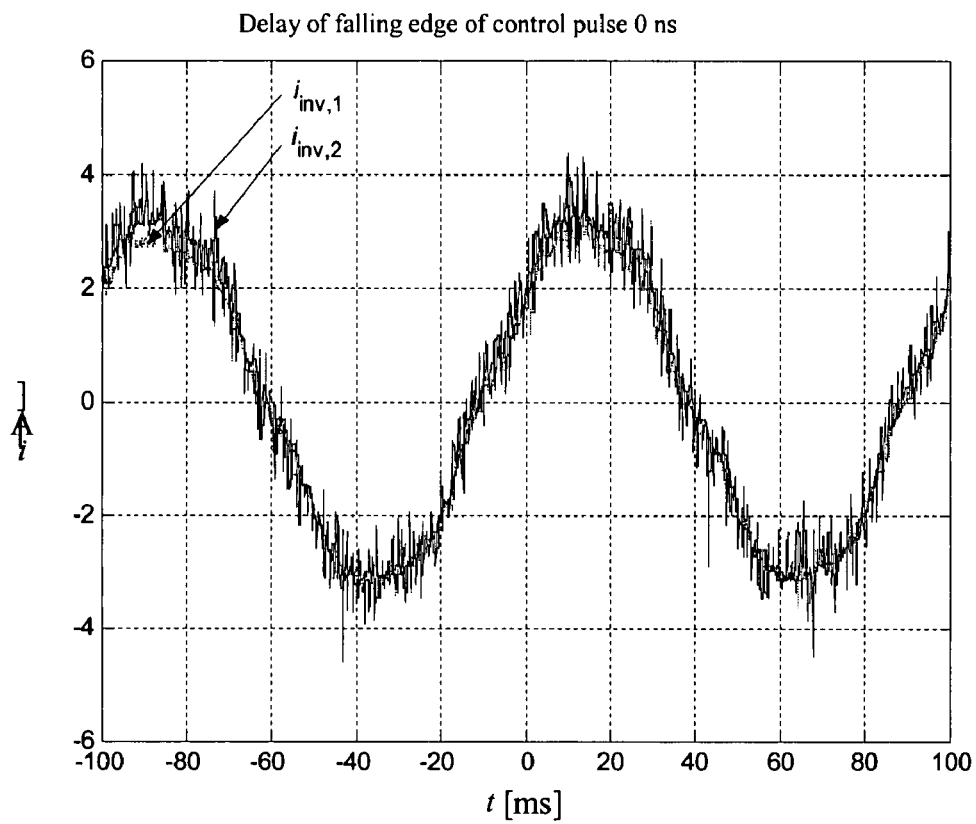
Figure 8:
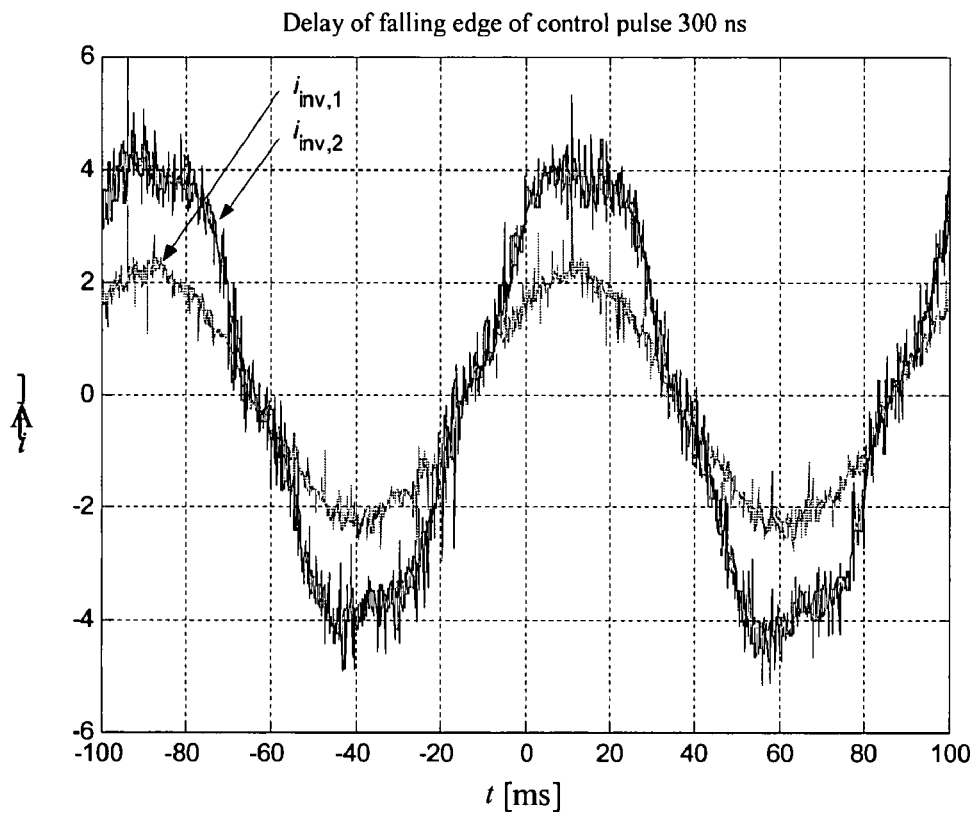

FIGS. 7 and 8 present the measured output currents of frequency converters connected in parallel when the delay of the falling edge of the control pulse Δt=0 ns and Δt=300 ns, the inductance between the output terminals and the common point $L_{out}$=200 µH and the switching frequency is 10 kHz.

DETAILED DESCRIPTION OF PRIOR ART AND PREFERRED EMBODIMENTS OF THE INVENTION

FIG. 1 presents a motor drive, in which a three-phase alternating-current motor ~3 IM is supplied by two three-phase frequency converters FC1 and FC2 connected to a three-phase network $L_1$, $L_2$, $L_3$, in both of which is an input choke $L_{AC,1}$, $L_{AC,2}$, a diode rectifier bridge REC11, REC12, a DC-voltage intermediate circuit, in which is a capacitor $C_1$, $C_2$, and an inverter INU11, INU12 controlled by control pulses obtained from a control unit CU1, CU2 with pulse width modulation, which is a full-wave bridge rectifier provided with a semiconductor switch, such as an IGBT, and diodes connected in parallel with it. A three-phase alternating voltage U, V, W, which is supplied to the motor, is received as output voltage from the frequency converter.

FIGS. 2 and 3 present current peaks, caused by the non-simultaneity of the rising edge and falling edge of the control pulse, between appliances connected in parallel. FIG. 2 presents the output currents of two frequency converters connected in parallel in a case in which the different timing of the rising edge of the control pulse causes a current peak for the time 70 µs and increases to be clearly greater than the load current. FIG. 3 presents the output currents of two frequency converters connected in parallel in a case in which the different timing of the falling edge of the control pulse causes a current peak limited to the value of the load current for the time of approx. 56 µs.

FIG. 4 presents the control pulses of two IGBTs connected in parallel, of which the falling edge of one is delayed by Δt. Delaying of the control pulse is implemented such that the duration of the safety time is not exceeded nor is the rising edge of the control pulse of the IGBT firing after the safety time affected. The safety time means the dwell time of the control pulses needed in conjunction with switching of the phase switch, with which simultaneous conduction of the power switches of the upper arm and the lower arm is prevented. When the time differences made in the falling edge of the control pulses are small and inductance is added between the output terminals of the appliances connected in parallel, the amplitudes of current peaks caused by non-simultaneous control pulses do not grow substantially. This is important because with non-simultaneity of the falling edge the IGBT that extinguishes last conducts a large part of the load current and the current peak can grow to be as great as the load current. In this case it is necessary to cut off substantial overcurrent from the IGBT that extinguishes last, in which case the voltage stress over the power switch grows.

FIG. 4a is similar to FIG. 4, however with the difference that in this case the safety time also is deferred by the amount Δt, in which case also the rising edge of the control pulse of the IGBT firing after the safety time is delayed by the same amount Δt.

The main purpose of increasing the inductance is, however, to slow down the smoothing of the current peak caused by non-simultaneous timing. As a result of slower smoothing of the currents, a disbalance occurs in the current distribution of the appliances connected in parallel. The magnitude of the disbalance produced can be regulated with a switching time difference of the length Δt. The switching time difference implemented for specific phases must also be proportioned to the value of the phase current so that the waveform of the current remains as sinusoidal as possible.

FIG. 5 presents the output currents of frequency converters connected in parallel when the delay of the falling edge of the control pulse is varied between Δt=0 . . . 100 ns. Δt was, depending on the case, kept constant irrespective of the value of the phase current. The inductance between the output terminals and the common point was 100 μH (i.e. inductance 200 μH between the input terminals). It can be seen from the figure that the delay implemented in the falling edge of the control pulse causes a distinct disbalance in the current distribution.

FIG. 6 presents the disbalance d of the effective values of the output currents when the delay of the falling edge of the control pulse is varied between Δt=0 . . . 300 ns and the inductance between the output terminal and the common point varied between 1 . . . 100 μH (i.e. inductance between the output terminals varied between 2 . . . 200 μH). Δt was, depending on the case, kept constant irrespective of the value of the phase current. The disbalance in the effective values is solved with the equation $$d = \frac{\left(I_{max} - \left(\frac{I_{inv,1} + I_{inv,2}}{2}\right)\right)}{\left(\frac{I_{inv,1} + I_{inv,2}}{2}\right)} \cdot 100\%$$

the solution of which gives the difference of the current of the most loaded appliance with respect to the average value of the currents. It can be clearly seen from the figure that the delay implemented in the falling edge of the control pulse is not able to cause disbalance between the appliances connected in parallel if the inductance between the output terminals and the common point is too small (e.g. only short cables between the output terminals). The maximum permitted current deviation $\Delta I_{max}$, the switching frequency $f_{sw}$ and the maximum permitted delay of the falling edge Δt affect the measurement of inductance. One minimum requirement for inductance is obtained with the equation $$L_{min} = \frac{\Delta U \Delta t}{\Delta I_{max}},$$

where ΔU is the voltage difference between the output terminals during the switching time difference. The switching frequency also affects the minimum requirement for inductance because as the switching frequency decreases, the time interval of non-simultaneous switchings increases. During this time interval the currents equalize at a time constant set by the system. By increasing the inductance the time constant can be increased.

FIGS. 7-8 present the measured output currents of two frequency converters connected in parallel when the power balance is regulated by means of the falling edge of the control pulse and inductances of 200 μH are connected between the output terminals and the common points (i.e. 400 μH inductance between the output terminals). In the examples of the figures the delay of the falling edge of the control pulses Δt=0 and Δt=300 ns, and it remains constant irrespective of the value of the phase current. In FIG. 7 the control pulses are identical, i.e. Δt=0 ns and in FIG. 8 Δt=300 ns.

The disbalance caused to current distribution by the delay of the falling edge can be clearly seen in the measurement FIGS. 7-8. The distortion of the waveform of the current caused by the unscaled delay to the current can also be clearly seen in FIG. 8. By delaying the falling edge of the control pulse it is thus possible to regulate, among other things, the disbalance caused by non-idealities of the output stages. The current distribution is shown in FIG. 6. The distribution seems to be almost directly comparable to the length of the delay. The above holds true, however, only in cases in which there is sufficient inductance between the output terminals.

By synchronizing the firing times, the current peak produced between appliances connected in parallel can be eliminated, which can increase the load current to a higher value. When the firing times are synchronized, uneven distribution of the power can be regulated by delaying the falling edge of the control pulse.

It is obvious to the person skilled in the art that the different embodiments of the invention are not limited solely to the example described above, but that they may be varied within the scope of the claims presented below. Instead of separate control units, the semiconductor switches of the inverters can also be controlled with a shared control unit.

The invention claimed is:

1. A method for equalizing output powers of a first and second frequency converter connected in parallel, the first frequency converter including a first semiconductor bridge, the second frequency converter including a second semiconductor bridge, the method comprising:
controlling the first and second semiconductor switch bridges with respective first and second pulse width modulated bridge control pulses by delaying a falling edge of the second pulse width modulated control pulse relative to a falling edge of the first pulse width modulated control pulse,
wherein the step of delaying a falling edge of the second pulse width modulated control pulse relative to a falling edge of the first pulse width modulated control pulse comprises:
changing a delay of the falling edge of the second pulse width modulated control pulse as a function of an output current.

2. A motor drive, comprising:
a first and second frequency converter connected in parallel, the first frequency converter including a first semiconductor bridge, the second frequency converter including a second semiconductor bridge; and
at least one controller configured to control the first and second semiconductor switch bridges with respective first and second pulse width modulated bridge control pulses by delaying a falling edge of the second pulse width modulated control pulse relative to a falling edge of the first pulse width modulated control pulse,
wherein the at least one controller is configured to change a delay of the falling edge of the second pulse width modulated control pulse as a function of an output current.

* * * * *